United States Patent
Van Schyndel et al.

(10) Patent No.: US 6,859,141 B1
(45) Date of Patent: Feb. 22, 2005

(54) ELECTRIC FIELD PROXIMITY DETECTOR FOR FLOATING AND GROUNDED TARGETS

(75) Inventors: Andre J. Van Schyndel, Onatrio (CA); Diane J. Clayton, Ontario (CA)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 09/456,567

(22) Filed: Dec. 8, 1999

(51) Int. Cl.$^7$ ................................................ G08B 13/16
(52) U.S. Cl. .................... 340/562; 340/686.6; 324/658; 324/663; 324/688; 341/33
(58) Field of Search ........................ 379/420; 340/854.8, 340/870, 856.3, 854.6, 562–564, 686.6; 341/33; 361/271; 324/658, 659, 661, 662, 663, 679, 681, 683, 686, 687, 688, 690

(56) References Cited

U.S. PATENT DOCUMENTS

| | | | |
|---|---|---|---|
| 3,826,979 A | * 7/1974 | Steinmann | 361/178 |
| 4,016,490 A | * 4/1977 | Weckenmann et al. | 324/671 |
| 5,166,679 A | 11/1992 | Vranish et al. | 340/870.37 |
| 5,337,353 A | * 8/1994 | Boie et al. | 379/433.01 |
| 5,491,423 A | * 2/1996 | Turetta | 324/663 |
| 5,729,604 A | 3/1998 | Van Schyndel | 379/388.01 |
| 5,802,479 A | * 9/1998 | Kithil et al. | 701/45 |
| 5,973,318 A | * 10/1999 | Plesko | 250/227.22 |
| 5,986,549 A | * 11/1999 | Teodorescu | 340/561 |
| 6,025,726 A | * 2/2000 | Gershenfeld et al. | 324/671 |
| 6,051,981 A | * 4/2000 | Gershenfeld et al. | 324/663 |
| 6,275,146 B1 | * 8/2001 | Kithil et al. | 340/425.5 |
| 6,348,862 B1 | * 2/2002 | McDonnell et al. | 340/562 |

OTHER PUBLICATIONS

Joshua Smith et al., "Electric Field Sensing For Graphical Interfaces", MIT Media Laboratory, May/Jun. 1998, pp. 54–60.

J.R. Smith, "Field mice: Extracting hand geometry from electric field measurements", IBM Systems Journal, vol 35, Nos. 3 & 4, 1996, pp. 587–608.

* cited by examiner

*Primary Examiner*—Benjamin C. Lee

(57) ABSTRACT

An electric field proximity detector capable of detecting partially conductive or conductive objects regardless of their impedance to circuit ground. The detector has a sensor with a transmitting electrode, a receiving electrode, and at least one circuit ground electrode preferably arranged in a bulls-eye configuration with the ground electrode between the transmitter and receiver electrodes. With appropriate sizing, upon the approach of an object, a signal received by the receiving electrode decreases, at least until the object is within a threshold distance of the sensor. The size and positioning of the ground electrode further reduces the effects of stray capacitance.

31 Claims, 8 Drawing Sheets

THEVENIN EQUIVALENT

ELECTRIC FIELD PROXIMITY DETECTOR FOR FLOATING AND GROUNDED TARGETS

FIELD OF THE INVENTION

The present invention relates to proximity detectors, and more particularly to proximity detectors that employ electric field sensing to detect physical objects.

BACKGROUND OF THE INVENTION

Electric field proximity detectors are well known. Various types of detectors have been documented which utilize electric fields to sense the presence of conductive or partially conductive objects entering their effective field of detection. Generally, objects are detected by measuring signal changes resulting from perturbations in a generated electric field. Electric field proximity detectors are advantageous in that they are generally safe, fast, inexpensive, and capable of measuring object distance to a high degree of resolution.

One specific variety of electric field sensing proximity detector is the so-called transmit-receive type. In a typical configuration, this variety of detector generates a low-frequency electric field at one transmitting electrode and detects the electric field at a second receiving electrode. Intruding objects affect the degree of capacitive coupling between the transmitting electrode and receiving electrode, and as a result their presence may be detected by measuring changes in the signal at the receiving electrode.

Known transmit-receive detectors operate predominantly in two modes. The first, or transmitter, mode is triggered when objects with high impedance to circuit ground (that is, electrically floating objects) enter the generated electric field. In this mode, the floating object behaves essentially as a conductive extension of the transmitting electrode. Electrical charge from the generated electric field travels along the object towards the receiving electrode more efficiently than it does through free space, and as a result, the capacitive coupling between the transmitting electrode and the receiving electrode increases. Accordingly, the signal at the receiving electrode also increases, and the proximity of the floating object is thereby indicated. (The foregoing assumes that the floating object is not so large as to behave like an earth-grounded object.)

The second, or shunt, mode is triggered when objects with low impedance to circuit ground (that is, objects grounded to circuit ground) enter the generated electric field. In this mode, the capacitive coupling between the transmitting electrode and the receiving electrode decreases as the grounded object draws near because the intruding object effectively shunts the intercepted electric field to circuit ground. Accordingly, the signal at the receiving electrode decreases as the object approaches, and the proximity of the grounded object is thereby indicated.

The existence of two separate modes of operation in known transmit-receive proximity detectors as described has two notable disadvantages. The first drawback is the added complexity in detector circuitry that is required to detect both floating and grounded objects. Because floating objects trigger an increase in current at the receiving electrode whereas grounded objects trigger a decrease in current, detector circuitry must be capable of detecting both of these types of signal changes. This requirement may add to the complexity of detector circuitry, especially if the device is intended to be capable of distinguishing between floating versus grounded objects.

The second and more serious drawback of the two operating modes of known detectors is the resulting inability of these devices to reliably sense objects with intermediate degrees of ground impedance. Again, because objects with high impedance to earth ground trigger an increase in current at the receiving electrode whereas objects with low impedance to circuit ground trigger a decrease in current, it follows that, for certain objects with intermediate impedance to circuit ground, no perceptible change in current will occur at the receiving electrode. Objects having such a degree of ground impedance may therefore, disadvantageously, escape detection. As a result, known transmit-receive proximity detectors are poorly suited for many safety applications.

Still another drawback of known transmit-receive type detectors is their susceptibility to stray capacitance. Component circuitry associated with the transmission and detection of the electric field in these devices may emit stray electric fields and capacitances that influence the measured signal at the receiving electrode. As a result, this stray capacitance may jeopardize proper object detection.

Hence what is needed is a transmit-receive type electric field proximity detector that is capable of reliably detecting objects, regardless of their impedance to circuit ground, that additionally has a reduced susceptibility to the corrupting effect of stray capacitance, and that optimally provides a single characteristic signal change for all detected objects.

SUMMARY OF THE INVENTION

It is an object of the present invention to provide a transmit-receive type electric field proximity detector which permits objects to be reliably detected regardless of their impedance to circuit ground.

The present invention may also provide a transmit-receive type electric field proximity sensor with reduced susceptibility to stray capacitance.

The present invention may further provide a transmit-receive type electric proximity detector suitable for use in safety applications, such as the automatic switching of a portable or cellular telephone from loudspeaker mode to handset mode when the handset is brought close to the user's ear, for example.

Briefly, in the present invention, at least one circuit ground electrode is used in addition to the traditional transmitting and receiving electrodes. The circuit ground electrode, transmitting electrode and receiving electrode are sized and arranged such that, as a target object draws near, there is a prevailing decrease in the current at the receiving electrode (at least outside a threshold distance) upon the intrusion of any conductive or partially conductive object, regardless of its impedance to earth ground.

In addition, the positioning of the ground electrode with respect to the detector circuitry may be such that the sensing electrodes are effectively shielded from the stray electric fields and capacitances that may be induced by component circuitry within the device. This results in reduced susceptibility to stray capacitance.

In accordance with one aspect of the present invention, there is provided a transmit-receive type electric field proximity detector suitable for detecting partially conductive or conductive objects regardless of their impedance to circuit ground, said detector comprising: a transmitting electrode; a receiving electrode; and at least one ground electrode, arranged and sized such that, upon the approach of an object, a signal received by said receiving electrode decreases, at least until said object is within a threshold distance of one of said transmitting electrode, receiving electrode, and at least one ground electrode.

In accordance with another aspect of the present invention, there is provided a sensor suitable for use in a transmit-receive type electric field proximity detector, said sensor having a circuit ground and comprising: a transmitting electrode; a receiving electrode; and at least one circuit ground electrode, arranged and sized such that, upon the approach of an object, the effective impedance between the receiver electrode and the at least one circuit ground electrode decreases more quickly than the sum of the impedance between the receiver electrode and the at least one circuit ground electrode and the impedance between the transmitting electrode and the receiving electrode, at least until said object is within a threshold distance of one of said transmitting electrode, receiving electrode, and at least one ground electrode.

In accordance with yet another aspect of the present invention, there is provided a communications device comprising:
  (a) a transmit-receive type electric field proximity detector suitable for detecting partially conductive or conductive objects regardless of their impedance to circuit ground, said detector comprising:
    a transmitting electrode;
    a receiving electrode; and
    at least one ground electrode,
      arranged and sized such that, upon the approach of an object, the effective impedance between the receiver electrode and the at least one circuit ground electrode decreases more quickly than the sum of the impedance between the receiver electrode and the at least one circuit ground electrode and the impedance between the transmitting electrode and the receiving electrode, at least until said object is within a threshold distance of one of said transmitting electrode, receiving electrode, and at least one ground electrode,
    said detector further comprising detector circuitry coupled to said receiving electrode and being responsive to the induced electrical signal therefrom for generating an output signal indicative of the approach of an intruding object; and
  (b) a switch capable of switching between a receiver mode and a loudspeaker mode;
  said output signal of said proximity detector being coupled to said switch to operate said communications device in loudspeaker mode when said device is separated by at least a predetermined threshold distance from a user's ear and in the receiver mode when said device is separated by less than said predetermined threshold distance from the user's ear.

In accordance with a further aspect of the invention, there is provided a sensor suitable for use in a transmit-receive type electric field proximity detector, said sensor having a circuit ground and comprising: a transmitting electrode driven with a low impedance; a receiving electrode actively held at circuit ground potential; and at least one circuit ground electrode connected to an earth ground, arranged and sized such that, upon the approach of an object, the capacitance between the object and circuit ground increases more quickly than the product of the capacitance between the object and the transmitting electrode and the capacitance between the object and the receiving electrode, at least until said object is within a threshold distance of one of said transmitting electrode, receiving electrode, and at least one ground electrode.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

In figures which illustrate, by way of example, embodiments of the present invention.

DETAILED DESCRIPTION

Figure 1:
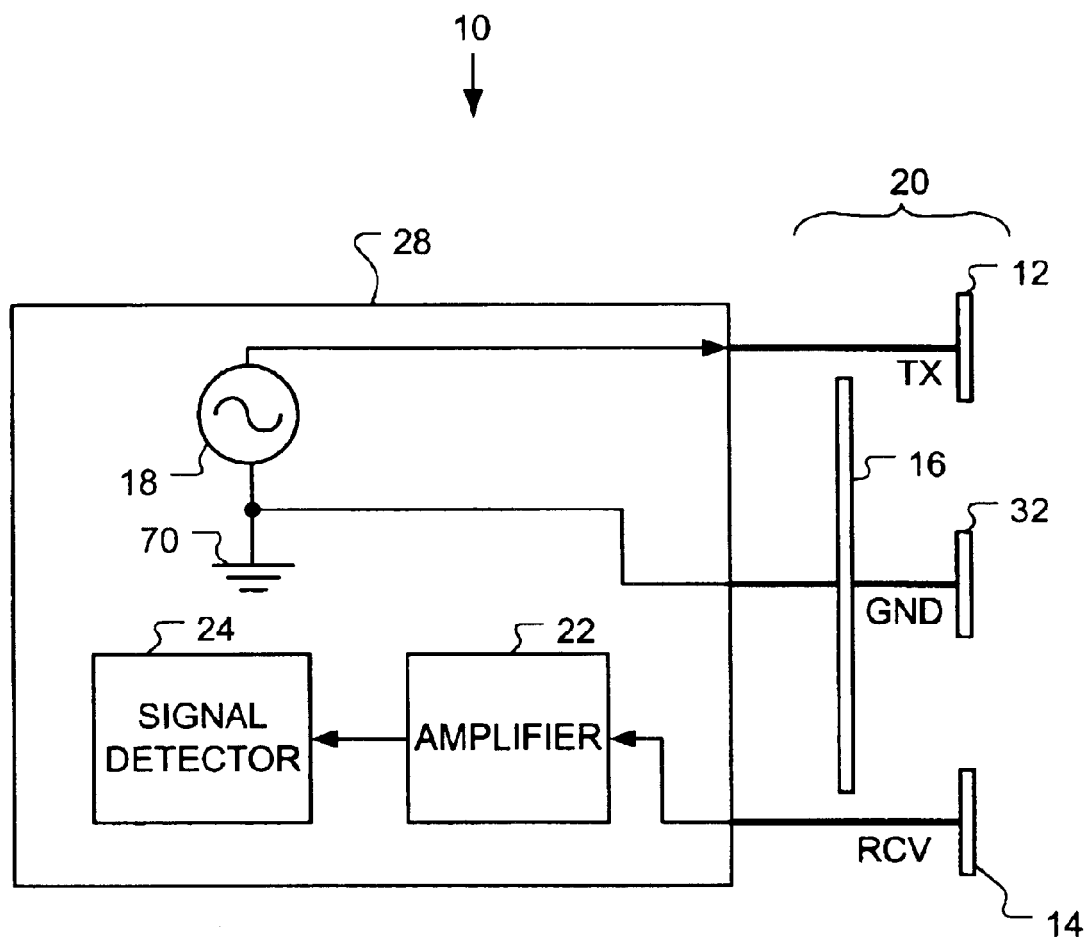
FIG. 1 is a schematic diagram illustrating an electric field proximity detector exemplary of an embodiment of the present invention.

With reference to the schematic diagram of FIG. 1, a proximity detector 10 has a sensor 20 coupled to a detector body 28. The sensor 20 comprises a transmitting electrode 12, a receiving electrode 14, a first ground electrode 32 and a second ground electrode 16. The ground electrodes 32 and 16 are electrically coupled to one another but are electrically insulated from both the transmitting electrode 12 and the receiving electrode 14. The actual position and sizing of the electrodes is described hereinafter.

Detector body 28 houses electronic circuitry including an oscillator 18, an amplifier 22, and preferably, a signal detector 24. The oscillator 18 consists of a low-frequency alternating current ("AC") signal generator. The output of oscillator 18 is electrically coupled to the transmitting electrode 12. The ground electrodes 32 and 16 are electrically coupled to the circuit ground 70 of the detector circuitry. It should be noted that circuit ground 70 may in fact be distinct from earth ground. The receiving electrode, amplifier, and signal detector circuitry are electrically coupled in series, such that the receiving electrode 14 is coupled to the input of the amplifier 22, and the output of the amplifier 22 is coupled to the input of the signal detector 24.

The proximity detector 10 generates an electric field from the transmitting electrode 12 and detects an electric field 44 at the receiving electrode 14. The generated field is a low-frequency field with a wavelength λ much larger (at least 10 times greater) than the characteristic size of the system (the system now including the distance to the object) as defined hereinbefore, with larger wavelengths being preferable. An embodiment with the object being up to 10 cm distant may therefore have a frequency up to about 300 kHz. To achieve an acceptable signal-to-noise ratio, the lower bound on the frequency is about 10 kHz.

Sensor 20 is oriented and positioned in relation to the detector circuitry such that the ground electrode 16 is interposed between the detector circuitry and the "active" electrodes, namely, the transmitting and receiving electrodes 12 and 14.

Figure 2A:
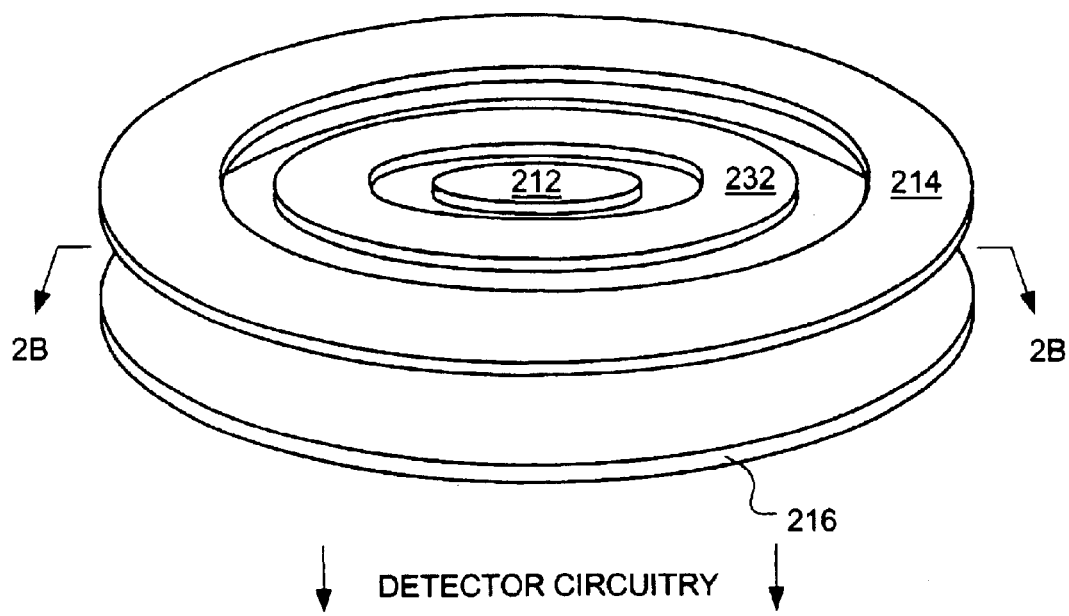
FIG. 2A is a perspective view of a sensor configuration in accordance with FIG. 1.
Figure 2B:
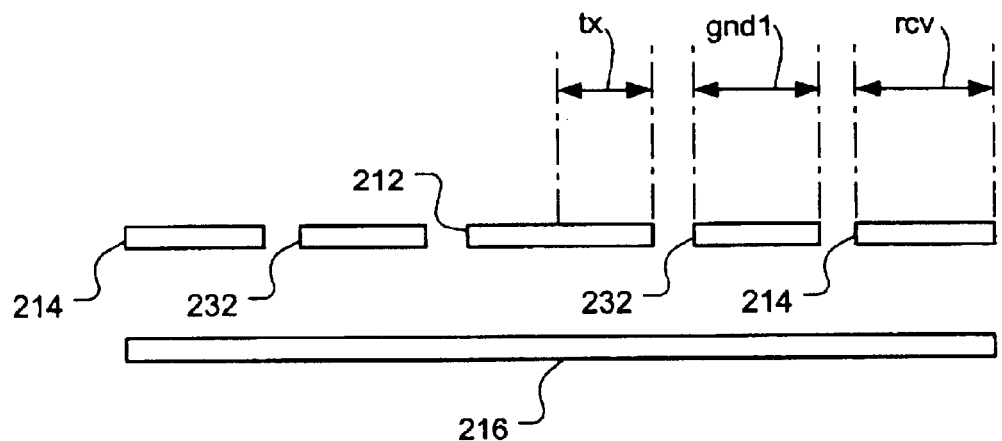
FIG. 2B is a cross-sectional view from the side along the line 2B—2B of FIG. 2A.

FIGS. 2A and 2B illustrates an exemplary configuration for the sensor 20 of FIG. 1. Referring to FIGS. 2A and 2B, the electrodes of the sensor 220 lie in two generally parallel planes, with the transmitting, receiving and first ground electrodes 212, 214 and 232, respectively, lying in a front plane in a "bulls-eye" configuration, and the second ground electrode 216 occupying a back plane behind the other electrodes.

The transmitting electrode 212 consists of a generally circular disk of conductive material, forming the center of the "bulls-eye" configuration. The receiving electrode 214 is a circular annular ring of conductive material and surrounds transmitting electrode 212. The ground electrode 232, which is also a generally circular annular ring of conductive material, is interposed between the central transmitting electrode 212 and the surrounding receiving electrode 214. The three electrodes in the front plane are nested concentrically about a common center line and are spaced from one another. More specifically, the ground electrode 232 has an outer diameter less than the inner diameter of the surrounding receiving electrode 214, and an inner diameter greater than the diameter of the central transmitting electrode 212.

In the back plane, the ground electrode 216 is a generally circular plate of conductive material with a diameter approximately equal to the outer diameter of the outermost receiving electrode 214. The ground electrode 216 in the back plane is electrically coupled to ground electrode 232, however, both electrodes 232 and 216 are electrically insulated from the transmitting electrode 212 and the receiving electrode by a non-conductive material, such as rubber or air for example.

The relative proportions of the front plane electrodes may be as set out in Table I below. With reference to FIG. 2B, 'tx' is the radius of the central transmitting electrode 212, 'gnd1' is the inner diameter to outer diameter width of the annular ring ground electrode 232, and 'rcv' is the inner diameter to outer diameter width of the annular ring receiving electrode 214. The ranges of Table I are suitable for an approaching object with a relative radius of 55. It should be noted that these proportions are relative, rather than in fixed units.

TABLE I

Relative Proportions of Sensor Electrodes

| Electrode Measurement | Range |
|---|---|
| tx | 0 < tx < 15 |
| gnd1 | 0 < gnd1 < 15 |
| rcv | 5 < rcv < 25 |

Thus if, for example, the approaching object had a radius of 110 mm, a suitable radius for the transmitter would be between 0 and 30 mm, a suitable annular width for the front plane ground electrode would be between 0 and 30 mm and a suitable annular width for the receiver would be between 10 and 50 mm.

When any one of the three front plane electrodes is sized at the small end of its range as set forth in Table I, the remaining two electrodes may generally exceed the maximum end of their corresponding ranges. This is reflected in the further exemplary relative ranges set out in Table II below, which again are based on an object with a relative size of 55.

TABLE II

Relative Proportions of Sensor Electrodes

| R of tx | Δr of gnd1 | Δr of rcv |
|---|---|---|
| 1 | 1 | 1–30 |
| 1 | 5 | 1–45 |
| 1 | 10 | 1–35 |
| 1 | 20 | 10–20 |
| 5 | 1 | 1–35 |
| 5 | 5 | 1–45 |
| 5 | 10 | 1–40 |
| 10 | 1 | 1–40 |
| 10 | 5 | 1–30 |
| 10 | 10 | 5–30 |
| 20 | 1 | 1–20 |
| 20 | 5 | 1–15 |

The thickness of the electrodes is much less (at least ten times smaller) than the characteristic size of the system (that is, the length of a side of a cube that completely, though just, encloses the entire sensor).

Spacing between electrodes in the front plane is at least as large as the thickness of the electrodes. Furthermore, spacing between the ground electrode 216 in the back plane and the electrodes of the front plane is much less (at least ten times smaller) than the characteristic size of the system as defined above.

Figure 3:
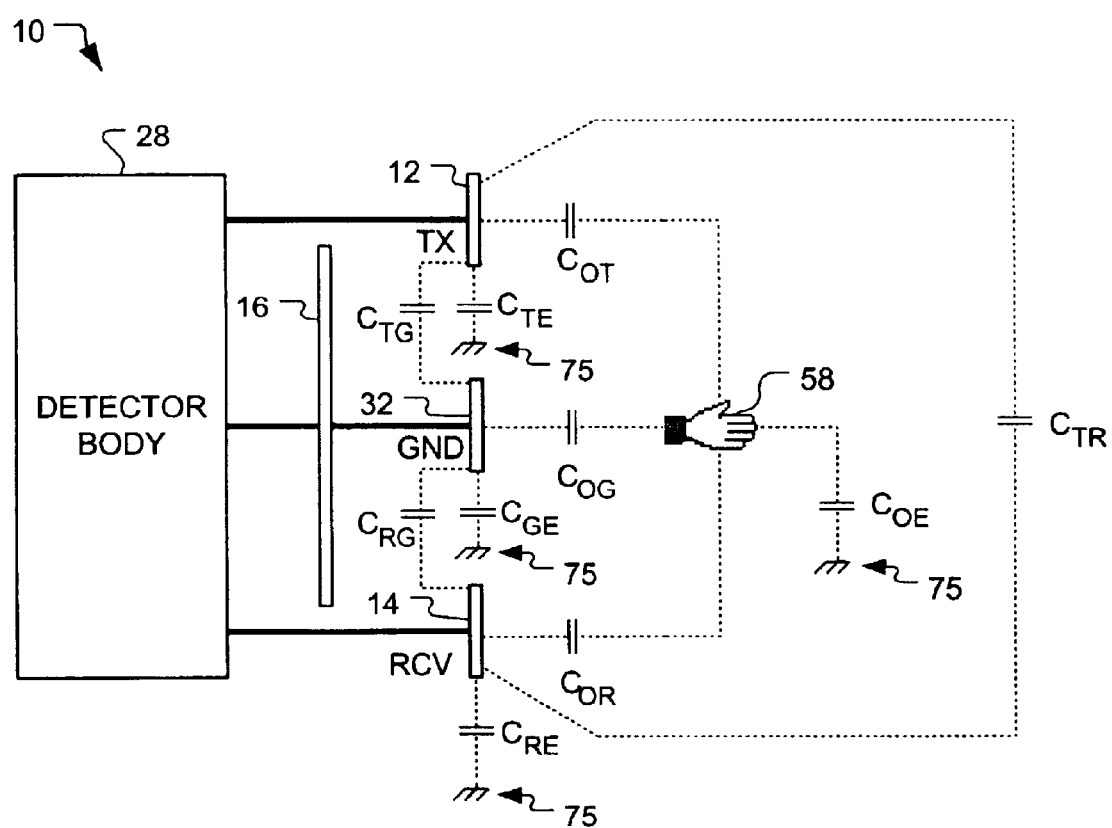
FIG. 3 is a schematic diagram illustrating the relevant capacitances existing in the embodiment of FIG. 1 as an object is sensed.

In FIG. 3, capacitances governing the functionality of the detector are illustrated.

The transmitting electrode 12 and receiving electrode 14 act as two electrodes of a capacitor, forming a capacitance $C_{TR}$ between them. Moreover, the transmitting and receiving electrodes form capacitances $C_{TG}$ and $C_{RG}$, respectively, with circuit ground (represented by ground plate 32) and $C_{TE}$ and $C_{RE}$, respectively, with earth ground 75. The circuit ground also has a capacitance with earth ground: $C_{GE}$. An intruding object may also function as a capacitor electrode. For example, an intruding object 58 acts as an electrode, forming capacitances $C_{OT}$, $C_{OG}$, and $C_{OR}$ with the transmitting, ground, and receiving electrodes 12, 32 and 14, respectively, as well as a capacitance $C_{OE}$ with earth ground 75.

Figure 3A:
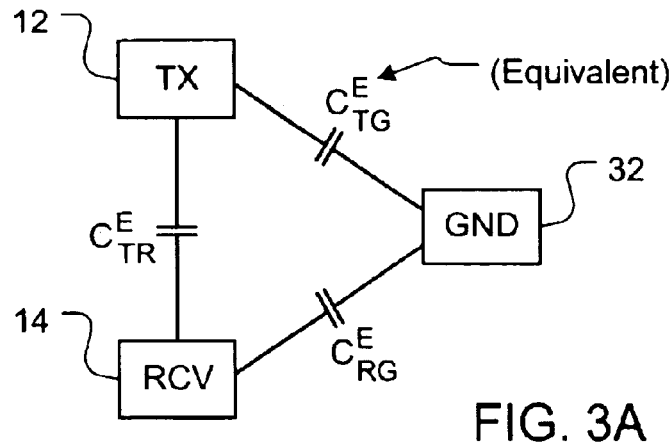
FIG. 3A is a Thevenin equivalent of the diagram of FIG. 3.

The capacitances indicated in FIG. 3 may be reduced to the Thevenin equivalent capacitances illustrated in FIG. 3A. The value of each equivalent capacitance, $C^E_{TR}$, $C^E_{TG}$, $C^E_{RG}$, will, of course, change as the object moves. However, the Thevenin equivalent shows that the ratio of the voltage at the receiver to that at the transmitter is as follows:

$$V_{RX}/V_{TX} = Z^E_{RG}/(Z^E_{RG} + Z^E_{TR}) \tag{1}$$

where each Z term is an impedance term such that $Z=1/j\omega C$ (with j being the square root of minus 1 and so the oscillator signal frequency). Equation (1) indicates that the voltage at the receiver will decrease as the object approaches if the impedance between the receiver and ground, $Z^E_{RG}$, decreases more quickly than the sum of the impedances between the receiver and ground and the transmitter and receiver, ($Z^E_{RG}+Z^E_{TR}$). This results for the sensor configuration described in conjunction with FIGS. 2A and 2B, at least until the object approaches to within a threshold distance.

Figure 3B:
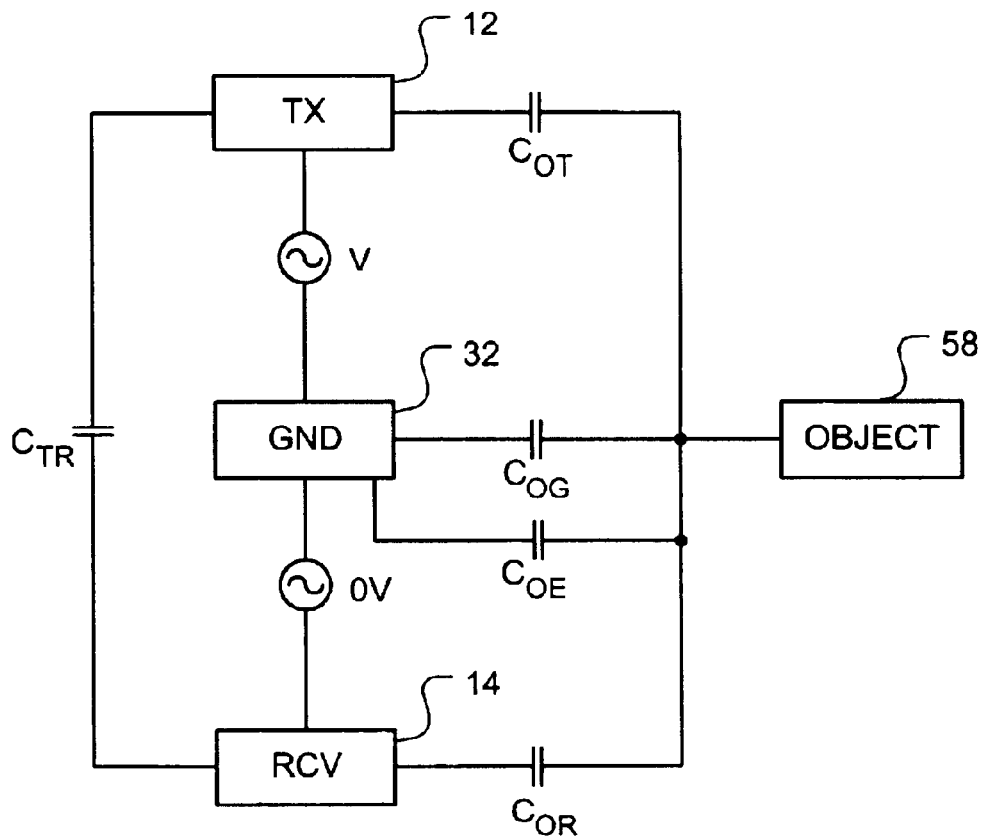
FIG. 3B is a simplified diagram following from the diagram of FIG. 3 given certain assumptions.

For the case where (i) the receiver is actively held at ground potential, (ii) the transmitter is driven with a low impedance, and (iii) the circuit ground is connected to the earth ground, the diagram of FIG. 3 simplifies to that shown in FIG. 3B. The operation of the detector 10 is explained in the context of this simplified case. With reference to FIG. 3B, noting that the current into the receiver is that through $C_{TR}$ and that through $C_{OR}$, and also $I_{CTR}=j\omega V\, C_{TR}$ and $I_{COR}=j\omega V_0\, C_{OR}$, we have the following:

$$\frac{V_O}{V} = \frac{Z_{OR}\|Z_{OE}\|Z_{OG}}{Z_{OT}+Z_{OR}\|Z_{OE}\|Z_{OG}} = \frac{C_{OT}}{C_{OT}+C_{OR}+C_{OE}+C_{OG}}$$

This implies the induced current at the receiving electrode $I_R$ is defined by the equation $$I_R = j\omega V\left(C_{TR} + \frac{C_{OR}C_{OT}}{C_{OR}+C_{OT}+C_{OG}+C_{OE}}\right) \quad (2)$$

When no object is present within the effective sensing range of the detector, it will be appreciated that the numerator of the second parenthetical term, that is, the product of $C_{OR}$ and $C_{OT}$, is zero. Therefore, the base current $I_{R\ BASE}$, which represents the steady state receiver current when no intruding object is present, is defined by the equation $$I_{R\ BASE}=j\omega V\, C_{TR\ BASE}$$

where $C_{TR}$ BASE represents the steady state capacitance between the transmitting and receiving electrodes when no object is present.

Figure 4A:
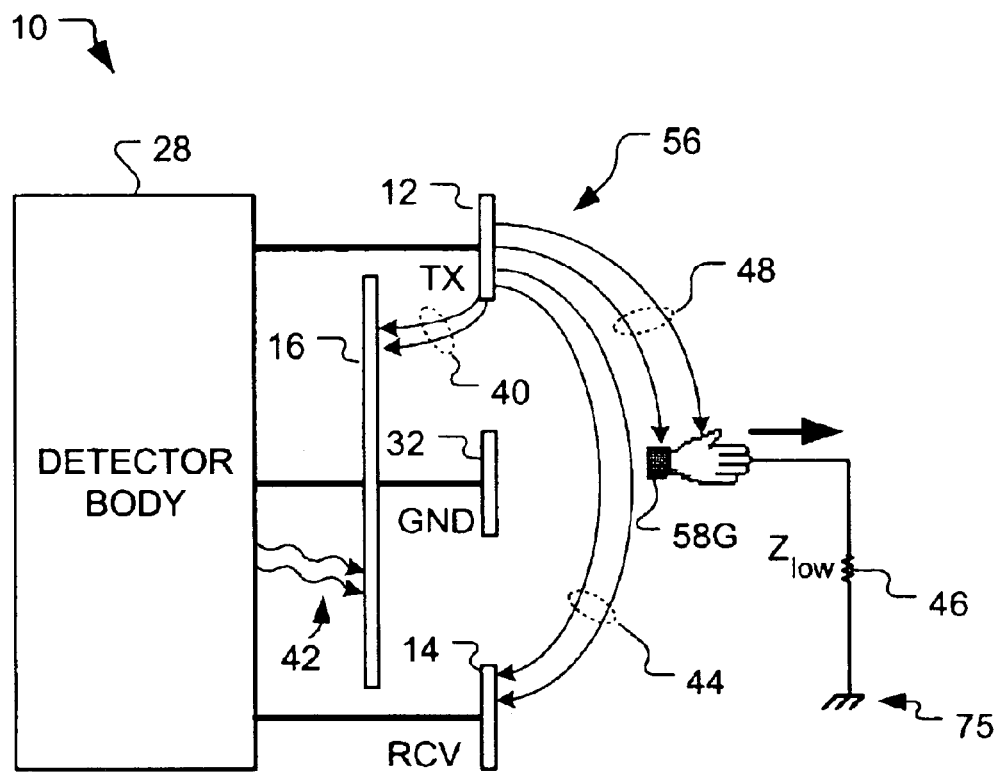
FIG. 4A is a schematic diagram illustrating the electrical field associated with the embodiment of FIG. 1 sensing an object with low impedance to earth ground.

In FIG. 4A, however, an electrically grounded object 58G has entered the effective sensing range of the detector 10. Note that the electrically grounded status of the object 58G is represented by its connection to earth ground 75 through low impedance $Z_{low}$ 46. A low impedance is defined in this context as an impedance that is much less than the characteristic impedance of the system (i.e., the impedance between the object and a combination of all the sensor electrodes). Because the impedance Z of the approaching object 58G to circuit ground is low, the capacitance COG becomes very large by virtue of the relationship $$C_{OG} = \frac{1}{j\omega Z}$$

Therefore, provided $C_{OG}$ remains much greater than $C_{OR}$ and $C_{OT}$, equation (2) reduces to $$I_R=j\omega V\, C_{TR} \quad (3)$$

Consequently, with a low impedance between the object and ground, the receiver current IR can be approximated by equation (3). Thus, it will be observed that in the case of grounded objects, the receiver current is dependent upon the capacitive coupling $C_{TR}$ between the transmitting electrode and the receiving electrode.

As the grounded object 58G approaches the sensor, it intercepts a portion 48 of the generated electric field 56. The interception of the electric field by the object 58G changes the shape of the electric field and causes a portion 48 of the electric field 56 to be shunted away from the receiving electrode 14 to ground 70 through the impedance $Z_{low}$ 46. This in turn decreases the capacitive coupling $C_{TR}$ from its base level $C_{TR\ BASE}$. Accordingly, and with reference to the equation (3), the current $I_R$ at the receiving electrode 14 also decreases from its base level $I_{R\ BASE}$. This decrease in current is then amplified by amplifier 22 (FIG. 1) and converted to a RMS (Root Mean Square) voltage value $V_{out}$ by the signal detector 24. Ultimately, the proximity of the object 58G is indicated by a decrease in the RMS voltage output $V_{out}$ of the signal detector 24.

Figure 4B:
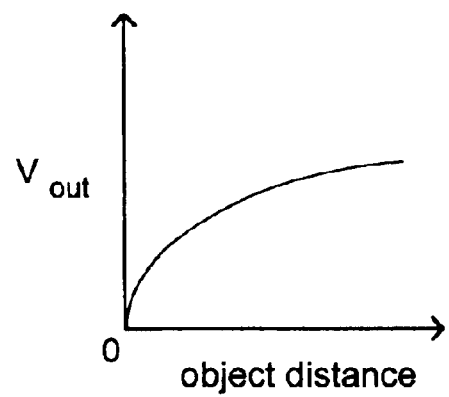
FIG. 4B is a graph illustrating the relationship between receiver current and the object-to-electrode distance of an object with low impedance to earth ground in the embodiment of FIG. 1.

FIG. 4B illustrates the general relationship of object-to-electrode distance to the detector's DC output $V_{out}$ when the detector 10 senses a grounded object 58G as illustrated in FIG. 4A. The relationship of FIG. 4B assumes that the object 58G is approaching the sensor along a straight line that is perpendicular to the front plane of the sensor and intersects the transmitting electrode 12 at its center. It will be appreciated that a decrease in the distance between the grounded object 58G and the detector 10 produces a strongly decreasing detector DC output, $V_{out}$.

Turning next to the sensing of partially floating or floating objects, that is, objects with intermediate or high impedance to ground, it will be appreciated that the receiver current in that case is defined by equation (2). A high impedance is defined in this context as an impedance that is much larger than the characteristic impedance of the system.

Figure 5A:
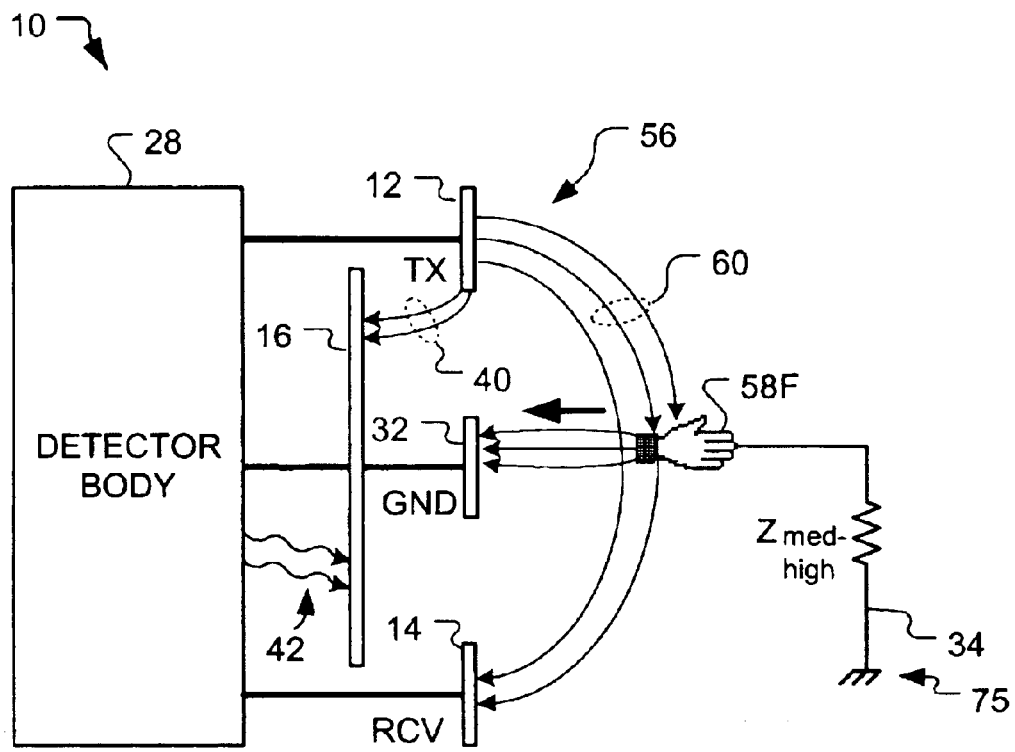
FIG. 5A is a schematic diagram illustrating the electrical field associated with the embodiment of FIG. 1 sensing an object with high impedance to earth ground.

As illustrated in FIG. 5A, a partially floating or floating object 58F is situated within the sensing range of the detector 10. The electrically floating status of the object 58F is represented by its connection to earth ground 75 through intermediate or high impedance $Z_{med-high}$ 34.

As the object 58F approaches, it intercepts a portion 60 of the generated electric field 56. Unlike the case for grounded objects, however, shunting of the intercepted portion directly to earth ground 75 is prevented by the intermediate or high impedance $Z_{med-high}$ 34. Instead, the field is shunted to circuit ground 70 (FIG. 1) by way of the object's capacitive coupling $C_{OG}$ to the sensor's ground electrodes 32 and 16.

With an appropriate choice for the sizing and spacing of the sensor electrodes (such as the "bulls-eye" configuration of FIG. 2A and ranges set out in Table I), as the object 58F approaches, the object's capacitive coupling $C_{OG}$ with ground electrodes 32 and 16 increases more quickly than the product of the object's capacitive couplings $C_{OR}$ and $C_{OT}$ with the receiving and transmitting electrodes 14 and 12, respectively. Accordingly, any potential increase in receiver current $I_R$ which might otherwise result from the approach of the floating object 58F, absent the capacitive coupling COG to ground electrodes 32 and 16, is overwhelmed by the decrease in receiver current $I_R$ caused by the shunting of charge to circuit ground 70 via the capacitive coupling $C_{OG}$, and the prevailing trend is a general decrease for $I_R$.

Figure 5B:
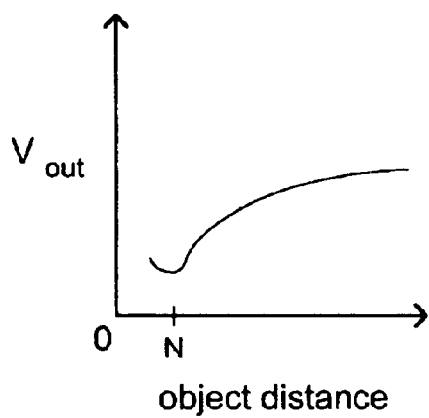
FIG. 5B is a graph illustrating the relationship between receiver current and the object-to-electrode distance of an object with intermediate or high impedance to earth ground in the embodiment of FIG. 1.

FIG. 5B illustrates the general relationship of object-to-electrode distance to the DC output $V_{out}$ of the detector 10 as it senses an object 58F with intermediate or high impedance to circuit ground as illustrated in FIG. 5A. Again, it is assumed that the object 58F is approaching the sensor along a straight line that is perpendicular to the front plane of the sensor and intersects the transmitting electrode 12 at its center. As hereinbefore described, a decrease in the distance between the grounded object 58G and the detector 10 produces a prevailing decrease in the DC output $V_{out}$. Note however that when a partially floating or floating object has come within very close range of the electrodes, less than distance N in the graph of FIG. 5B, the decreasing trend of the DC output $V_{out}$ may reverse itself, and the DC output $V_{out}$ may then increase rather than decrease as the object draws still closer. With the sensor embodiment of FIG. 2A having relative proportions within the ranges set forth in Table I, and with the receiving electrode 214 having a relative outer diameter of 40 units, distance N is about 10 units. Nonetheless, as recognized by those skilled in the art, proximity detection may still reliably occur through techniques such as the setting of an appropriate threshold receiver current, for example, such that the object will be detected well outside the range at which trend reversal occurs.

Thus, whenever an intruding object is detected, a monotonic decrease in receiver current (at least outside a threshold distance) is produced regardless of the ground impedance of the approaching object. Consequently, the complexity of signal detector circuitry may be reduced from that of known transmit-receive detectors. Additionally, this monotonic decrease promotes greater detector reliability because of the reduced likelihood that objects having intermediate earth ground impedance will escape detection.

In an alternative embodiment, the transmitting electrode and the receiving electrode may be reversed, such that the central disk comprises the receiving electrode and the outermost annular ring comprises the transmitting electrode. In this case, the behavior of the proximity detector will be as described for the preferred embodiment above, provided that the receiving electrode 14 is actively maintained at circuit ground potential. When the receiving electrode 14 is not held actively at circuit ground potential, the relative proportions of the sensor electrodes for which object detection will occur may differ from those indicated above for the preferred embodiment.

Figure 7:
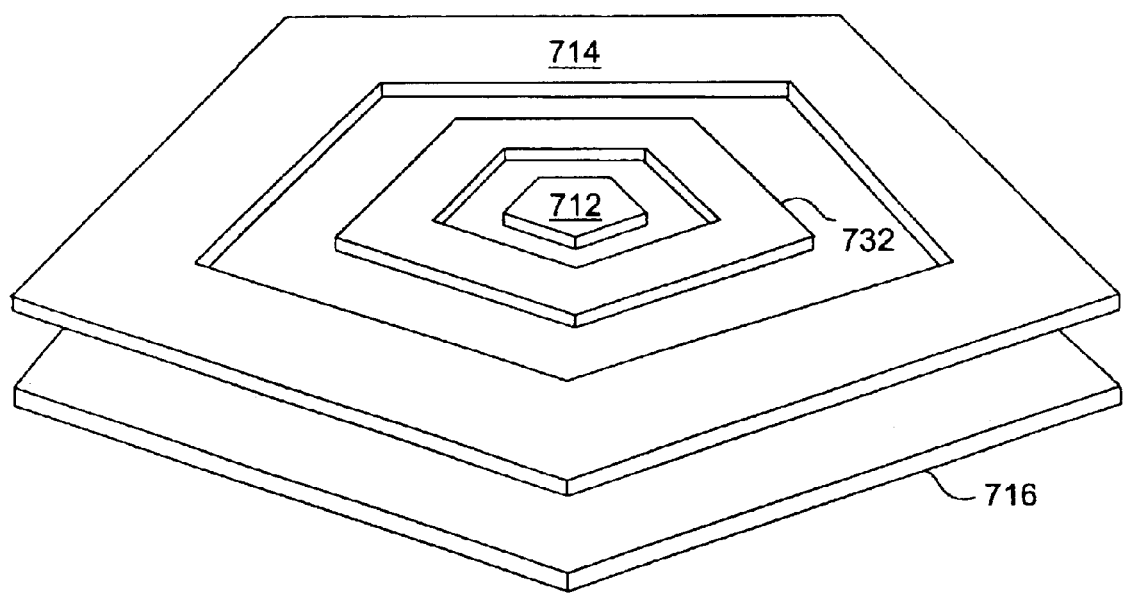
FIG. 7 is a perspective view of an alternative sensor configuration in accordance with FIG. 1.

In alternative embodiments, the shape of the transmitting, receiving and ground electrodes may be polygonal rather than circular, such as square, hexagonal or octagonal for example. In this case, each electrode may have a different polygonal shape or some or all of the electrodes may have the same polygonal shape. An exemplary arrangement is shown in FIG. 7. Again, in this case, the relative proportions of the sensor electrodes for which object detection will occur may differ from those indicated above for the preferred embodiment.

It should be noted that, during detector operation, the circuitry housed within the detector body 28 may produce stray electric fields 42 (FIGS. 4A and 5A) that emanate toward the sensor 20. If allowed to reach the transmitting or receiving electrodes 12 or 14, these electric fields 42 may influence the induced receiver current IR at the receiving electrode, potentially posing a risk to proper object detection. The risk of such stray capacitance, however, is significantly reduced as a result of the positioning of the ground electrode 16 between the detector circuitry and the receiving and transmitting electrodes 14 and 12. As illustrated in FIGS. 4A and 5A, stray electric fields 42 are intercepted by ground electrode 16 before they are able to reach the transmitting or receiving electrodes 12 or 14, and the stray electric charge is consequently shunted to circuit ground 70. Thus, the influence of stray electric fields on the receiver current $I_R$ is diminished, and therefore the detector's susceptibility to stray capacitance is reduced.

The risk of stray capacitance may alternatively be reduced by encasing the detector circuitry in a ground box, or through the use of a faraday shield.

The back plane ground electrode 16 additionally promotes directionality in object detection. As understood by persons skilled in the art, the electric field 56 generated by transmitting electrode 12 (FIGS. 4A and 5A) radiates not only towards the receiving electrode 14 but in all directions. A portion 40 of this field may in fact radiate back towards the detector circuitry. Because ground electrode 16 is interposed between the detector circuitry and the transmitting and receiving electrodes, it forms a barrier to such fields. Backwards-emanating fields like the exemplary field 40 are intercepted by this barrier and shunted to circuit ground 70. As a result, the electric field generated by the transmitting electrode 12 is prevented from emanating into the region behind the back plane's ground electrode 16. Accordingly, objects approaching from behind the ground electrode 16 do not intercept the generated electric field and therefore do not affect the current $I_R$ at the receiving electrode 14. Hence, an overall degree of directionality for the proximity detector 10 is promoted, whereby objects approaching from behind the ground electrode 16 may not be detected, yet objects approaching from other angles may be detected.

While two ground electrodes 32 and 16 are preferred, it will be appreciated that alternative embodiments may utilize a different number of ground electrodes, provided that at least one is used, namely, electrode 32. In cases where the number of electrodes is greater than one, each of the electrodes is electrically coupled to circuit ground.

When the detector is in operation, the frequency and amplitude of the oscillator signal may be kept constant. Alternatively, the oscillator signal may be AM, FM, or phase modulated to allow a better signal-to-noise ratio (SNR) at the signal detector 24 (FIG. 1).

It will be recognized that, because of its ability to reliably detect objects regardless of their impedance to earth ground, the proximity detector 10 is well suited for safety applications. One such suitable safety application is the automatic switching of a personal communications device from loudspeaker or hands-free mode to handset mode. Many personal communication devices, such as cellular or portable telephones, have two operating modes. The first, or handset, mode is used during normal operation when the device is held in close proximity to the user's ear, and the second, or loudspeaker, mode is used when the user wishes to carry on a conversation hands-free. Because users often toggle between these two modes, as described for example in U.S. Pat. No. 5,729,604, there is a risk that the device may accidentally be brought within close range of a user's ear while in hands-free mode, and that the user's hearing may be damaged as a result of the high volume levels associated with the hands-free mode. In this regard, a distance less than about 10 millimeters from the ear is considered to be an unsafe distance with such devices for hands-free operation.

Figure 6:
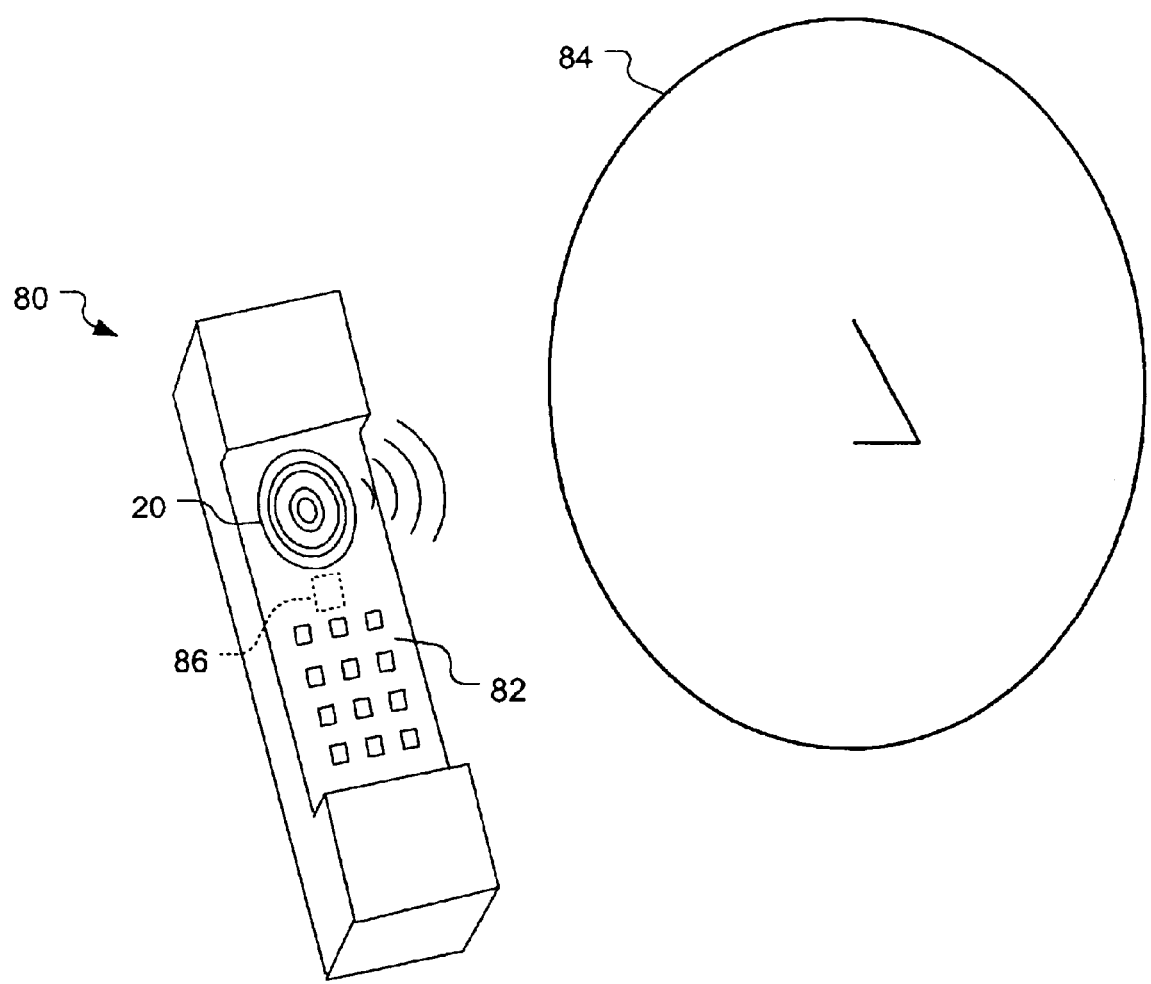
FIG. 6 is a schematic diagram of a system incorporating the detector of FIG. 1 with the sensor configuration of FIG. 2A.

The present invention may significantly improve the safety of a communications device employing both handset and hands-free modes. More specifically, referencing the exemplary embodiment of FIG. 6 along with FIG. 1, the sensor 20 of a proximity detector 10 is mounted in the face plate 82 of a communications device 80. The detector circuitry may be housed within the body of the device on the opposite side of the second ground electrode 16 from the transmitting and receiving electrodes 12 and 14. The sensor is oriented within the device to permit objects approaching from the face plate side of the device to be detected. In the present embodiment, the detector output is coupled to a switch 86 allowing the device to be toggled between its two operating modes. In the event that the device is accidentally brought to the ear of a user 84 while in hands-free mode, the proximity detector 10, sensing the presence of the user's ear at an unsafe distance, switches the device into handset mode. The DC level output from the detector at which switching occurs may be chosen so that switching occurs when an object is about 50 millimeters from the sensor. Thus, the risk of damage to the user's hearing may be reduced, regardless of whether the user is equivalent to a grounded object or a floating object.

The foregoing is merely illustrative of the principles of the invention. Those skilled in the art will be able to devise numerous arrangements which, although not explicitly shown or described herein, nevertheless embody those principles that are within the spirit and scope of the invention, as defined by the claims.

What is claimed is:

1. A transmit-receive type electric field proximity detector suitable for detecting partially conductive or conductive objects regardless of their impedance to circuit ground, said detector comprising:
   a transmitting electrode;
   a receiving electrode; and
   at least one ground electrode,
arranged and sized such that, upon the approach of an object, independent of the impedance to circuit ground of said object a signal received by said receiving electrode des at least until said object is within a threshold distance of one of said transmitting electrode, receiving electrode, and at least one ground electrode.

2. The proximity detector of claim 1, further comprising a signal generator electrically coupled to the committing electrode.

3. The proximity detector of claim 2, wherein the signal generator is a low frequency oscillator.

4. The proximity detector of claim 1, wherein one of the transmitting electrode and receiving electrode is a generally circular disk of conductive material, and the other of the transmitting electrode and receiving electrode is a generally circular annular ring of conductive material, said transmitting and receiving electrodes being arranged concentrically in substantially the same plane.

5. The proximity detector of claim 4, wherein said at least one ground electrode comprises a first ground electrode being a generally circular annular ring of conductive material interposed between, and lying in substantially in the same plane as, the transmitting electrode and the receiving electrode.

6. The proximity detector of claim 5, wherein said at least one ground electrode further comprises a second ground electrode being a plate of conductive material having an extent at least equal to an extent of said other of said transmitting electrode and receiving electrode, said second ground electrode being positioned behind, and substantially parallel to, the transmitting electrode, receiving electrode, and first ground electrode.

7. The proximity detector of claim 6, wherein the first ground electrode is electrically coupled to the second ground electrode.

8. The proximity detector of claim 7, wherein the first ground electrode and second ground electrode are electrically insulated from said transmitting electrode and said receiving electrode.

9. The proximity detector of claim 8, wherein said transmitting electrode is said generally circular disk, and said receiving electrode is said surrounding generally circular annular ring.

10. The proximity detector of claim 5, wherein a relative diameter of the electrode disk is greater than 0 and less than 30, a relative inner diameter to outer diameter width of the annular ring ground electrode is greater than 0 and less than 15, and a relative inner diameter to outer diameter width of the outermost annular ring electrode is greater than 5 and less than 25.

11. The proximity detector of claim 8, further comprising detector circuitry coupled to said receiving electrode and being responsive to the induced electrical signal therefrom for generating an output signal indicative of the approach of an intruding object.

12. The proximity detector of claim 11, wherein said first ground electrode and said second ground electrode are electrically coupled to circuit ground of said detector circuitry.

13. The proximity detector of claim 12, wherein said second ground electrode is physically interposed between said detector circuitry and both the transmitting electrode and the receiving electrode.

14. The proximity detector of claim 13, wherein said detector circuitry further comprises a signal detector, an amplifier, and a rectifier, the input of said signal detector being electrically coupled to said receiving electrode, the input of said amplifier being electrically coupled to the output of said signal detector, and the input of said rectifier being electrically coupled to the output of said amplifier.

15. The proximity detector of claim 1, wherein send threshold distance is about 10 millimeters.

16. The proximity detector of claim 1, wherein one of the transmitting electrode and receiving electrode is a first plate of conductive material having a first polygonal outline, and the other of the transmitting electrode and receiving electrode is a second plate of conductive material having a second polygonal outline, said second plate having a concentric aperture, said aperture having a third polygonal outline, said transmitting and receiving electrodes being arranged concentrically in substantially the same plane.

17. The proximity detector of claim 16, wherein said at least one ground electrode comprises a first ground electrode being a third plate of conductive material having a fourth polygonal outline, said third plate having a concentric aperture, said aperture having a fifth polygonal outline, said first and electrode being interposed between, and lying in substantially in the same plane as, the transmitting electrode and the receiving electrode.

18. The proximity detector of claim 17, wherein said at least one ground electrode further comprises a second ground electrode being a fourth plate of conductive material having a sixth polygonal outline, said second ground electrode having an extent at least equal to an extent of said other of said transmitting electrode and receiving electrode, said second ground electrode further being positioned behind, and substantially parallel to, the transmitting electrode, receiving electrode, and first ground electrode.

19. The proximity detector of claim 18, each of said first, second, third, fourth, fifth and sixth polygonal outlines is a regular polygonal shape with sides of equal length.

20. The proximity detector of claim 19, wherein the first ground electrode is electrically coupled to the second ground electrode.

21. The proximity detector of claim 20, wherein the first ground electrode and second ground electrode are electrically isolated from said transmitting electrode and said receiving electrode.

22. The proximity detector of claim 21, wherein said transmitting electrode is said first plate, and said receiving electrode is said sounding, apertured second plate.

23. A sensor suitable for use in a transmit-receive type electrode field proximity detector, said sensor having a circuit ground and comprising:
   a transmitting electrode;
   a receiving electrode; and
   at least one circuit ground electrode, arranged and sized such that, upon the approach of an object, independent of the impedance to circuit ground of said object, the effective impedance between the receiver electrode and the at least one circuit ground electro decreases more quickly than the sum of the impedance between the receiver electrode and the at least one circuit ground electrode and the impedance between the transmitting electrode and the receiving electrode, at least until said object is within a threshold distance of one of said transmitting electrode, receiving electrode, and at least one ground electrode.

24. The sensor of claim 23, wherein one of the transmitting electrode and receiving electrode is a generally circular disk of conductive material, and, and the other of the transmitting electrode and receiving electrode is a generally circular annular ring of conductive material, said transmitting and receiving electrodes being arranged concentrically in substantially the same plane.

25. The sensor of claim 24, wherein said at least one ground electrode comprises a first ground electrode being a generally circular annular rin of conductive material interposed between and lying in substantially in the same plane as, the transmitting electrode and the receiving electrode.

26. The sensor of claim 25, when said at least one ground electrode further comprises a second ground electrode being a plate of conductive material having an extent at least equal to an extent of said other of said transmitting electrode and receiving electrode, said second ground electrode being positioned behind, and substantially parallel to, the transmitting electrode, receiving electrode and first ground electrode.

27. The sensor of claim 26, wherein the first ground electrode is electrically coupled to the second ground electrode.

28. The or of claim 27, wherein the first ground electrode and electrode ground electrode are electrically insulated from said transmitting electrode and said receiving electrode.

29. The sensor of claim 28, wherein said transmitting electrode is said generally circular disk, and said receiving electrode is said surrounding generally circular annular ring.

30. The seer of claim 25, wherein a relative diameter of the electrode disk is greater than 0 and less than 30, a relative inner diameter to outer diameter width of the annular ring ground electrode is greater than 0 and less than 15, and a relative inner diameter to outer diameter width of the outermost annular ring electrode is greater than 0 and less than 25.

31. A sensor suitable for use in a transmit-receive type electric field proximity detector, said sensor having a circuit ground and comprising:

a transmitting electrode driven with a low impedance;

a receiving electrode actively held at circuit ground potential; and at least one circuit ground electrode connected to an earth ground, arranged and sized such that, upon the approach of an object, independent of the impedance to circuit around of said object, the capacitance between the object and circuit ground increases more quickly than the product of the capacitance between the object and the transmitting electrode and the capacitance between the object and the receiving electrode, at least until said object is within a threshold distance of one of said transmitting electrode, receiving electrode and at least one ground electrode.

* * * * *

UNITED STATES PATENT AND TRADEMARK OFFICE
CERTIFICATE OF CORRECTION

PATENT NO.    : 6,859,141 B1
DATED         : February 22, 2005
INVENTOR(S)   : Andre J. Van Schyndel et al.

It is certified that error appears in the above-identified patent and that said Letters Patent is hereby corrected as shown below:

Column 11,
Line 20, replace "object a signal received by said receiving electrode des at" with -- object, a signal received by said receiving electrode decreases. --.
Line 25, replace "coupled to the committing electrode" with -- coupled to the transmitting electrode --.

Column 12,
Line 37, replace "first and electrode" with -- first ground electrode --.
Line 49, replace "of claim 18, each of said" with -- of claim 18, wherein each of said --.
Line 57, replace "isolated from said transmitting electrode" with -- insulated from said transmitting electrode --.
Line 61, replace "electrode is said sounding," with -- electrode is said surrounding, --.
Line 63, replace "electrode field proximity" with -- electric field proximity --.

Column 13,
Line 4, replace "circuit ground electro decreases" with -- circuit ground electrode decreases --.
Line 13, replace "material, and, and the other" with -- material, and the other --.
Line 20, replace "circular annular rin of conductive material interposed between" with -- circular annular ring of conductive material interposed between, --.
Line 23, replace "claim 25, when said at least one ground" with -- claim 25, wherein said at least one ground --.

Column 14,
Line 1, replace "The or of claim 27, wherein the first ground electrode and electrode ground electrode" with -- The sensor of claim 27, wherein the first ground electrode and second ground electrode --.
Line 8, replace "The seer of claim 25," with -- The sensor of claim 25— of coupled to the transmitting electrode --.

UNITED STATES PATENT AND TRADEMARK OFFICE
CERTIFICATE OF CORRECTION

PATENT NO.    : 6,859,141 B1
DATED         : February 22, 2005
INVENTOR(S)   : Andre J. Van Schyndel et al.

It is certified that error appears in the above-identified patent and that said Letters Patent is hereby corrected as shown below:

<u>Column 14 (cont'd),</u>
Line 24, replace "impedance to circuit around" with -- impedance to circuit ground --.

Signed and Sealed this

Twenty-first Day of March, 2006

JON W. DUDAS
*Director of the United States Patent and Trademark Office*